United States Patent
Abe et al.

(10) Patent No.: US 8,637,960 B2
(45) Date of Patent: Jan. 28, 2014

(54) NITRIDE SEMICONDUCTOR SUBSTRATE

(71) Applicant: Covalent Materials Corporation, Shinagawa-ku (JP)

(72) Inventors: Yoshihisa Abe, Hadano (JP); Jun Komiyama, Hadano (JP); Hiroshi Oishi, Hadano (JP); Akira Yoshida, Hadano (JP); Kenichi Eriguchi, Hadano (JP); Shunichi Suzuki, Hadano (JP)

(73) Assignee: Covalent Material Corporation, Shinagawa-Ku, Tokyo (JP)

( * ) Notice: Subject to any disclaimer, the term of this patent is extended or adjusted under 35 U.S.C. 154(b) by 0 days.

(21) Appl. No.: 13/633,473

(22) Filed: Oct. 2, 2012

(65) Prior Publication Data

US 2013/0082355 A1    Apr. 4, 2013

(30) Foreign Application Priority Data

Oct. 3, 2011    (JP) .................................. 2011-219182

(51) Int. Cl.
*H01L 29/20*    (2006.01)

(52) U.S. Cl.
USPC ................... 257/615; 257/613; 257/E33.023; 257/E33.025; 257/E33.028; 257/E33.033

(58) Field of Classification Search
USPC .................. 257/613, 615, E33.003, E33.013, 257/E33.023, E33.025, E33.028, E33.033; 438/933
See application file for complete search history.

(56) References Cited

U.S. PATENT DOCUMENTS

| 7,012,016 B2 * | 3/2006 | Gwo ............................. 438/602 |
| 2008/0224268 A1 * | 9/2008 | Abe et al. ...................... 257/615 |
| 2009/0065812 A1 * | 3/2009 | Abe et al. ...................... 257/201 |
| 2010/0244100 A1 * | 9/2010 | Oishi et al. .................... 257/201 |
| 2011/0062556 A1 * | 3/2011 | Komiyama et al. ........... 257/615 |

FOREIGN PATENT DOCUMENTS

| JP | 2005-85852 A | | 3/2005 |
| JP | 2007-96261 A | | 4/2007 |
| JP | 2009065025 A | * | 3/2009 |
| JP | 2010251738 A | * | 11/2010 |
| JP | 2011082494 A | * | 4/2011 |
| JP | 2011258782 A | * | 12/2011 |

OTHER PUBLICATIONS

J. Elsner et al., Theory of Threading Edge and Screw Dislocations in GaN, Nov. 10, 1997, Physical Review Letters, vol. 79, No. 19, pp. 3672-3675.*
S.C. Jain et al., III-nitrides: Growth, characterization, and properties, Feb. 1, 2000, Journal of Applied Physics, vol. 87, No. 3, pp. 965-1006.*
F.A. Marino et al., Effects of Threading Dislocations on AlGaN/GaN High-Electron Mobility Transistors, Jan. 2010, IEEE Transactions on Electron Devices, vol. 57, No. 1, pp. 353-360.*

* cited by examiner

*Primary Examiner* — Fernando L Toledo
*Assistant Examiner* — Christine C Lau
(74) *Attorney, Agent, or Firm* — Buchanan Ingersoll & Rooney PC

(57) ABSTRACT

A nitride semiconductor substrate is provided in which leak current reduction and improvement in current collapse are effectively attained when using Si single crystal as a base substrate. The nitride semiconductor substrate is such that an active layer of a nitride semiconductor is formed on one principal plane of a Si single crystal substrate through a plurality of buffer layers made of a nitride, in the buffer layers, a carbon concentration of a layer which is in contact with at least the active layer is from $1\times10^{18}$ to $1\times10^{20}$ atoms/cm$^3$, a ratio of a screw dislocation density to the total dislocation density is from 0.15 to 0.3 in an interface region between the buffer layer and the active layer, and the total dislocation density in the interface region is $15\times10^9$ cm$^{-2}$ or less.

2 Claims, 4 Drawing Sheets

Fig. 2

[Table 1]

| Layer | Reference numerals in the drawings | Composition | Layer thickness | Carbon concentration |
|---|---|---|---|---|
| | | | nm | $1 \times 10^{19}$ atoms/cm$^3$ |
| Active layer C | 70 | Al$_x$Ga$_{1-x}$N (X=0.25) | 30 | 0.05 |
| | 60 | GaN | 1000 | |
| Fifth layer | 50 | GaN | Fine adjustment allows fourth layer to be formed to have a thickness of 1300-1400 nm | 7 |
| Fourth layer (50 repeated depositions of 31 and 32) | 32 | AlN | | |
| | 31 | GaN | | |
| Second layer | 2 | Al$_x$Ga$_{1-x}$N (X=0.15) | 300 | 5 |
| First layer | 1 | AlN | 150 | |

Fig. 3

[Table 2]

| | Buffer layer carbon concentration 1×10¹⁹ atoms/cm³ | Screw dislocation density ratio | Total dislocation density 1×10⁹ cm⁻² | Radius of curvature of nitride semiconductor substrate | Withstand voltage property | Current collapse property | Comprehensive evaluation | Comment |
|---|---|---|---|---|---|---|---|---|
| Comparative Example 2 | 0.05 | 0.2 | 5 | △ | × | ○ | × | |
| Example 2 | 0.1 | | | ○ | △ | ○ | △ | Poor controllability of carbon resistance |
| Example 3 | 7 | | | ○ | ○ | ○ | ○ | |
| Example 4 | 10 | | | ○ | △ | ○ | △ | Poor controllability of total dislocation density |
| Comparative Example 3 | 20 | | | △ | △ | △ | × | |
| Comparative Example 4 | 7 | 0.12 | 5 | △ | △ | ○ | × | |
| Example 5 | | 0.15 | | ○ | ○ | ○ | ○ | |
| Example 6 | | 0.25 | | ○ | ○ | ○ | ○ | |
| Example 7 | | 0.3 | | ○ | △ | ○ | △ | |
| Comparative Example 5 | | 0.35 | | △ | △ | ○ | × | |

Fig. 4
[Table 3]

| | Buffer layer carbon concentration $1 \times 10^{19}$ atoms/cm$^3$ | Screw dislocation density ratio | Total dislocation density $1 \times 10^9$ cm$^{-2}$ | Radius of curvature of nitride semiconductor substrate Z | Withstand voltage property | Current collapse property | Comprehensive evaluation | Comment |
|---|---|---|---|---|---|---|---|---|
| Example 8 | 7 | 0.2 | 1 | △ | ○ | ○ | △ | Too low total dislocation density, leading to poor controllability of radius of curvature |
| Example 9 | | | 5 | ○ | ○ | ○ | ○ | |
| Example 10 | | | 10 | ○ | ○ | ○ | ○ | |
| Example 11 | | | 15 | ○ | △ | ○ | △ | High density, tending to lead to poor controllability of total dislocation density |
| Comparative Example 6 | | | 20 | × | △ | × | × | Large influence of excessive dislocation density |

NITRIDE SEMICONDUCTOR SUBSTRATE

BACKGROUND OF THE INVENTION

1. Field of the Invention

The present invention relates to a nitride semiconductor substrate in which a nitride semiconductor layer is formed on a Si single crystal substrate through a buffer layer made of a nitride.

2. Description of the Related Art

Nitride semiconductors, such as gallium nitride (GaN), aluminum nitride (AlN), etc., have outstanding heat resistance and high electron mobility, and are suitable for a high electron mobility transistor, a heterojunction field effect transistor, etc.

An example of the nitride semiconductor substrate using the nitride semiconductor would be one in which a nitride semiconductor layer serving as an active layer is formed on a hetero-material substrate through a buffer layer. Especially one that uses a Si single crystal for the substrate is advantageous for a large-diameter wafer or cost reduction.

Further, important electrical properties of the nitride semiconductor are leak current reduction and current collapse to be improved. Some technologies are known in which the properties are improved by improving the buffer layer.

Japanese Patent Application Publication No. 2005-085852 discloses a technology of a nitride compound semiconductor having an electrode and a semiconductor stack structure comprising at least a substrate, a buffer layer, an electron transit layer, and an electron supply layer, in which the buffer layer contains Mg, Be, Zn, or C at a concentration of from $1 \times 10^{16}$ to $1 \times 10^{21}$ cm$^{-3}$.

Japanese Patent Application Publication No. 2007-096261 discloses a technology of a semiconductor device comprising a low-temperature buffer layer, a buffer layer, an electron transit layer, and an electron supply layer which are each made of a GaN compound semiconductor and stacked on a substrate in that order, wherein an electron supply layer has thereon a source electrode, a gate electrode, and a drain electrode, and dislocation density of the buffer layer is a density where volume resistivity with respect to the dislocation density is close to the local maximum, or screw dislocation density ratio of the above-mentioned buffer layer on the basis of the above-mentioned dislocation density is 0.12 or less.

The technology described in Japanese Patent Application Publication No. 2005-085852 is such that a buffer layer includes a repetition structure of two layers having different thicknesses and compositions and the buffer layer is doped with Mg or C at a high concentration to be electrically neutral, thus reducing leak current.

However, if the buffer layer is doped with impurities at a high concentration, then crystal distortion becomes considerable and the dislocation density also increases, so that there arises a problem with the current collapse and crystallinity. Therefore, the doping alone does not allow sufficient improvement in the leak current reduction or the current collapse.

The technology described in Japanese Patent Application Publication No. 2007-096261 is such that, in particular, the ratio of the screw dislocation density to the total dislocation density of the buffer layer is set to 0.12 or less, so that the volume resistivity of the buffer layer may be of high resistance, to thereby improve the withstand voltage. Further, as a particular embodiment, it discloses data at the time of forming the nitride semiconductor on a sapphire substrate, and says that a material for the substrate is not limited to sapphire, but Si may be sufficient for it.

However, in the nitride semiconductor substrate having the structure where the nitride semiconductor layer is formed on the Si single crystal substrate through the buffer layer made of a nitride, even if the dislocation density and the dopant concentration are controlled to be within the range as described in Japanese Patent Application Publication No. 2007-096261, it is difficult to obtain a good withstand voltage and an improvement in current collapse.

Further, if the dislocation density and the dopant concentration are varied, the stress generating in the nitride film changes. Therefore, even if a good withstand voltage and a good current collapse are attained by varying the dislocation density and the dopant concentration, then the radius of curvature of the substrate decreases, this does not match with a device process but is out of object.

SUMMARY OF THE INVENTION

The present invention arises in view of such technical problems and aims at providing a nitride semiconductor substrate in which a Si single crystal is particularly used as a base substrate and a nitride semiconductor layer is formed through a buffer layer made of a nitride, thus reducing leak current and improving current collapse, as well as maintaining a large radius of curvature of the substrate, effectively controlling the leak current, and effectively reducing the current collapse.

The nitride semiconductor substrate in accordance with the present invention is a nitride semiconductor substrate in which an active layer of a nitride semiconductor is formed on one principal plane of a Si single crystal substrate through a plurality of buffer layers made of a nitride, wherein in the above-mentioned buffer layer, a carbon concentration of a layer which is in contact with at least the above-mentioned active layer is from $1 \times 10^{18}$ to $1 \times 10^{20}$ atoms/cm$^3$, a ratio of a screw dislocation density to the total dislocation density is from 0.15 to 0.3 in an interface region between the above-mentioned buffer layer and the above-mentioned active layer, and the above-mentioned total dislocation density in the interface region between the above-mentioned buffer layer and the above-mentioned active layer is $15 \times 10^9$ cm$^{-2}$ or less.

According to such a structure, it is possible to provide the nitride semiconductor substrate with which the leak current reduction and the improvement in current collapse are effectively achieved. It is further possible to maintain the large radius of curvature of the substrate, and to effectively attain the leak current control and the current collapse reduction.

Furthermore, as for the nitride semiconductor substrate in accordance with the present invention, it is desirable that the total dislocation density in the interface region between the buffer layer and the active layer is from $1.2 \times 10^9$ cm$^{-2}$ to $15 \times 10^9$ cm$^{-2}$.

According to the present invention, in the nitride semiconductor substrate in which the Si single crystal is particularly used as the base substrate and the nitride semiconductor layer is formed through the buffer layer made of a nitride, it is possible to effectively reduce the leak current and improve the current collapse, as well as maintain the large radius of curvature of the substrate, and effectively attain the leak current control and the current collapse reduction.

BRIEF DESCRIPTION OF THE DRAWINGS

FIG. 2 is a table showing a composition and a layer thickness of each layer shown in FIG. 1

FIG. 3 is a table showing evaluation results of examples 2 to 7 and comparative examples 2 to 5.

FIG. 4 is a table showing evaluation results of examples 8 to 11 and comparative example 6.

DESCRIPTION OF THE PREFERRED EMBODIMENTS

Figure 1:
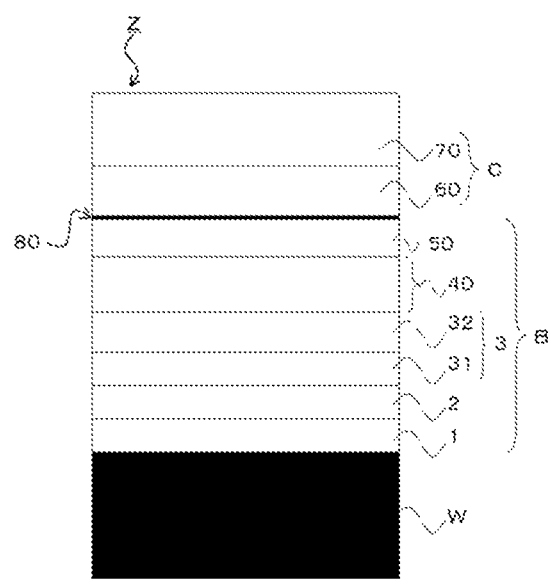
FIG. 1 is a schematic diagram showing a structure of a nitride semiconductor substrate in accordance with a preferred embodiment of the present invention when viewed in cross-section.

Hereinafter, a nitride semiconductor substrate in accordance with the present invention will be described in detail with reference to FIG. 1.

In a nitride semiconductor substrate Z in accordance with the present invention, an active layer C of a nitride semiconductor is formed on one principal plane of a Si single crystal substrate W through a buffer layer B made of a nitride.

A known substrate for a semiconductor can widely be applied to the Si single crystal substrate W. Each of specifications of a crystal growing method, a plane direction, oxygen concentration, impurities concentration, PN-type, surface roughness, thickness, etc. can also be appropriately set up according to requirements for the nitride semiconductor substrate Z to be designed.

As compared with other materials, the Si single crystal substrate W has the advantage that specific resistance and hardness can be adjusted appropriately with sufficient accuracy by varying the dopant concentration and oxygen concentration by way of a known technology.

It should be noted that a thickness of the Si single crystal substrate W is preferably from 300 to 2000 μm, where the thickness can be expressed by an average of five points within the plane including one point in the center of one principal plane of the Si single crystal substrate W and four circumferentially equi-spaced points at 5 mm from the circumference, for example.

The thickness of the Si single crystal substrate W influences control of a radius of curvature to be set forth later. When the substrate thickness is less than 300 μm, it is difficult to control the radius of curvature by means of the buffer layer B. On the other hand, when the substrate thickness exceeds 2000 μm, the controllability of the radius of curvature is not influenced, but film forming handling becomes complicated, since the weight of the substrate is large.

The buffer layer B is made of a nitride semiconductor and inserted when a nitride semiconductor layer is formed on a hetero-material substrate which is different in crystal orientation, thus having effects of controlling the dislocation and increasing the radius of curvature of the substrate (reducing the substrate curvature). One preferred embodiment is illustrated in FIG. 1, but the present invention is not limited thereto, and it is possible to arbitrarily choose a composition, a number of layers, a combination thereof according to the specification and the purpose of the nitride semiconductor to be designed.

A carbon concentration of a layer which is in contact with at least the active layer C i.e., a layer 50 which is a part of the buffer layer B in FIG. 1, is from $1\times10^{18}$ to $1\times10^{20}$ atoms/cm$^3$. For example, by way of secondary ion mass analysis method (SIMS), the carbon concentration can be measured by choosing an arbitrary point in the buffer layer B. For example, the central part of the one principal plane of the nitride semiconductor substrate Z can also be chosen as the measurement point.

It should be noted that, as for the carbon concentration of the buffer layer B, the fifth layer 50 which is in contact with at least a layer 60 of the active layer C may only be within the carbon concentration range of the present invention. For example, the whole buffer layer B, only the fifth layer 50, or only a fourth layer 40 and the fifth layer 50 may be within this carbon concentration range.

In the present invention, an interface region 80 is a plane formed in contact with the fifth layer 50 and a sixth layer 60 in FIG. 1, however it is not strictly limited only to the 2-dimensional plane section.

The measurement of the interface region 80 is evaluated including part of the fifth layer 50 and sixth layer 60 in the thickness direction perpendicular to a principal plane direction. Therefore, taking into consideration non-uniformity of the layer thickness and surface unevenness of the layer, a range of ±1 nm in the thickness direction of each layer shall be substantially included in the interface region 80 in the present invention.

For example, except for the first layer 1 and the second layer 2 shown in FIG. 1, the fourth layer 40 and the fifth layer 50 may be dealt with in terms of the carbon concentration of the present invention. This is because the influence of the carbon concentration of the present invention on the interface region 80 is small in the region near the Si single crystal substrate W.

Carbon doped in the buffer layer B captures electrons generated by dislocation particularly in 3-5 group nitrides to neutralize the electrons electrically and causes the buffer layer B to be highly resistant. For controlling the leak current, the high resistance is required. The heavier carbon doping, the better. Conversely, however, the dislocation density increases, and it is inappropriate to increase the doping concentration too much.

A carbon concentration of less than $1\times10^{18}$ atoms/cm$^3$ does not provide the effect of the high resistance. If it exceeds $1\times10^{20}$ atoms/cm$^3$, the influence of increase in dislocation density becomes considerable. Neither of them is preferred. It is preferable that the carbon concentration is from $1\times10^{19}$ to $7\times10^{19}$ atoms/cm$^3$.

As for the nitride semiconductor substrate Z in accordance with the present invention, a ratio of a screw dislocation density to the total dislocation density in the interface region 80 is from 0.15 to 0.3. Here, by "total dislocation density" we mean a density of the dislocation combining edge dislocation and screw dislocation. It should be noted that one that influences the leak current control and current collapse reduction is the dislocation density of the interface region 80, thus the dislocation density in the buffer layer B can be represented by the dislocation density measured in the interface region 80 in the present invention.

In other words, with respect to the ratio to the total dislocation density, when the screw dislocation density is controlled to be from 0.15 to 0.3, the leak current control and current collapse reduction can be attained suitably, while maintaining the large radius of curvature of the nitride semiconductor substrate Z.

According to the known technology, it is possible to reduce the leak current in the buffer layer B by controlling the ratio of the screw dislocation density to the total dislocation density of the buffer layer B to be low, i.e. increasing the edge dislocation density.

However, the present inventors have found that when the Si single crystal substrate W is used as a base substrate, the buffer layer B having the edge dislocation density to some extent leads to the larger radius of curvature of the nitride semiconductor substrate Z. In other words, when the radius of curvature of the nitride semiconductor substrate Z is increased, then the edge dislocation density is reduced to some extent.

The reason for this is that a thermal expansion coefficient of GaN is larger than that of Si, and that when the temperature is returned to room temperature after film forming by a vapor deposition process etc., the Si single crystal substrate W having formed therein GaN as a film becomes concave if the film forming side is turned up. Tensile stress applied to the film of GaN causes generation of a crack, and reduction of the radius of curvature of the nitride semiconductor substrate Z, i.e., generation of a considerable curvature.

In order to solve the above-mentioned problems, the buffer layer B for controlling stress is usually provided between the GaN layer and the Si single crystal substrate W. Since compressive stress is arranged to be applied to the GaN layer to which the tensile stress is applied, the radius of curvature of the nitride semiconductor substrate Z is controlled at room temperature, i.e., from 5 to 40° C.

It follows that, in this case, the bi-axial compressive stress is applied perpendicularly to the growth direction of GaN. Since the edge dislocation has the Burgers vector perpendicularly to the growth direction, it is thought that when the compressive stress is applied to the GaN layer, it acts on the Burgers vector, leading to elimination of the dislocation. In other words, it follows that stress control is carried out appropriately and the nitride semiconductor substrate Z having a large radius of curvature at room temperature has a somewhat small edge dislocation density.

As such, by suitably choosing the ratio of the edge dislocation of the buffer layer B to the screw dislocation like the preferred embodiments of the present invention, it is possible to realize control of the leak current and an improvement in current collapse of the buffer layer B in a situation where the radius of curvature of the nitride semiconductor substrate Z is kept large.

In the case where the ratio of the screw dislocation density to the total dislocation density is less than 0.15, there is almost no change in the high resistance or current collapse. On the other hand, the radius of curvature of the nitride semiconductor substrate Z becomes small, i.e. it has a considerable curvature. Further, if it exceeds 0.3, then the screw dislocation density is excessive, and there is almost no change in current collapse. On the other hand, the leak current increases. Furthermore, the radius of curvature of the nitride semiconductor substrate Z becomes small, i.e. it has a considerable curvature. More preferably, it is from 0.15 to 0.25.

Now, the screw dislocation density is calculated from a rocking curve half-value width of a GaN (0002) side by X-ray diffractometry, and the edge dislocation density is calculated from a rocking curve half-value width of a GaN (10-10) side by way of a known method. It should be noted that a measurement point for the dislocation density may be one point in the center of one principal plane of the nitride semiconductor substrate Z is satisfactory, however it is possible to employ five points in the plane or nine points in the plane, as necessary.

In addition, in the preferred embodiments of the present invention, the calculation of the dislocation density is carried out by using a method in the X-ray diffractometry described in the reference shown below: "T. Metzger, R. Hopler, E. Born, O. Ambacher, M. Stutzmann, R. Stommer, M. Schuster, H. Gobel, S. Christiansen, M. Albrecht, and H. P. Strunk and "Defect structure of epitaxial GaN films determined by transmission electron microscopy and triple-axis X-ray diffractometry", Philos, Mag. A, Phys. Condens. Matter Defects Mech. Prop., vol. 77, no. 4, pp. 1013-1025, 1998"

Further, as shown in FIG. 1, when the buffer layer B has a structure where plural pairs of nitride semiconductor layers are stacked, the layers of the pair being made of mutually different compositions or having different film thicknesses, it has an advantage that precise dislocation density and curvature control can be attained, and this is preferred.

The total dislocation density in the interface region 80 is $15\times10^9$ cm$^{-2}$ or less. If it exceeds $15\times10^9$ cm$^{-2}$, it causes the increase in the leak current and the generation of a crack.

More preferably, the total dislocation density in the interface region 80 is from $1.2\times10^9$ to $15\times10^9$ cm$^{-2}$. This is because if it is $1.2\times10^9$ cm$^{-2}$ or less, there is almost no change in the high resistance or current collapse; on the other hand, the radius of curvature of the nitride semiconductor substrate Z becomes small, and it may result in a considerable curvature. It should be noted that it is more preferably from $1.5\times10^9$ to $10\times10^9$ cm$^{-2}$ from a viewpoint with easy controllability of the total dislocation density.

As an example of a preferred method for manufacturing the nitride semiconductor substrate Z of the present invention, there may be mentioned an organometallic chemical vapor deposition (MOCVD) process. Because it is advantageous that its film forming controllability is remarkable, reproducibility of the layer is good, and the ratio between the dislocation density and the screw dislocation density can be adjusted appropriately under the manufacturing conditions of the buffer layer B.

As described above, according to the present invention, especially in the nitride semiconductor substrate using the Si single crystal as the base substrate and having formed therein the nitride semiconductor layer through the buffer layer made of a nitride, it is possible to effectively attain the leak current reduction and the improvement in current collapse, while maintaining the large radius of curvature of a substrate.

Further, according to the present invention, when a device perpendicular to one principal plane of the substrate is designed, the current collapse is also improved and the vertical withstand voltage can be improved.

Hereinafter, the preferred embodiments of the present invention will be described with reference to Examples, however the present invention is not limited to Examples.

Example 1

A nitride semiconductor substrate Z having a layer structure of FIG. 1 was produced according to the following steps. A Si single crystal substrate W with a diameter of 4 inches, a plane direction (111), a specific resistance of 0.02 Ωcm, a thickness of 0.62 mm (one point in the center), and N-type (common manufacture conditions) was placed in an MOCVD apparatus. As materials for the nitride semiconductor, trimethyl gallium (TMG), trimethyl aluminum (TMA), NH$_3$, and methane were used. These materials were used appropriately according to the layer to be stacked. By setting a vapor-deposition temperature to 1000° C., each layer was formed by the vapor deposition process to have a composition and a layer thickness shown in Table 1 (FIG. 2). It should be noted that the composition, the layer thickness, and a carbon concentration of each layer shown in Table 1 (FIG. 2) were attained by selecting each material and adjusting a flow rate and supply time.

The withstand voltage and current collapse of this nitride semiconductor substrate Z were each evaluated. Assuming the withstand voltage for the device to be perpendicular, grooves of a recess gate region and an element separation region were formed by dry etching, an Au electrode having a diameter of 2 mm was formed as a gate electrode on the active-layer side, Al electrodes having a diameter of 0.5 mm were formed as source and drain electrodes, and an Al electrode was formed as a back electrode on the back side of the Si substrate by way of vacuum deposition respectively, so as to produce a vertical device to which electric field was applied and its withstand voltage was measured using a commercial curve tracer.

An electric field of 100 V was applied across a gate and a drain for 5 minutes as bias application, and the current collapse was determined by (ON resistance after application of bias/ON resistance before application of bias). In this case, when there is no current collapse, an ON resistance ratio is one (1). When current collapse exists, the current collapse is larger than one (1).

Further, using a known shape measurement apparatus for a semiconductor substrate, a radius of curvature can be measured and calculated simultaneously with a curvature. Here, the measurement was carried out using a commercial shape measurement apparatus (product model: EMS2002AD-3D, manufactured by Coms Corporation (JAPAN)).

The ratio of the screw dislocation density to the total dislocation density of the buffer layer B was measured and evaluated in the one point in the center of the principal plane of the nitride semiconductor substrate Z by the method using the above-mentioned X-ray diffractometry.

Example 1 showed a withstand voltage of 700 V, which was a good value. Further, an ON resistance ratio showing the current collapse was 1.8 which was also a good value. It should be noted that the screw dislocation density ratio was 0.2 and the total dislocation density was $5 \times 10^9$ cm$^{-2}$.

Comparative Example 1

Comparative Example 1 was carried out with the same standard, the same process, and the same evaluation method as those in Example 1, except that the substrate W was of sapphire.
Since sapphire is an insulating substrate, the vertical withstand voltage was not measured, while only the current collapses were compared.

In Comparative Example 1, the ON resistance ratio was 2.4 which was larger than that in Example 1 and it was inferior in terms of the current collapse. Here, although the structures of the nitride layers including the buffer layer B were completely the same, it is thought that the base substrates of different conductivity might cause different current collapses.

Examples 2-7, Comparative Examples 2-5

Samples for evaluation were produced under conditions shown in Table 2 (FIG. 3), and other steps and evaluation methods were the same as those in Example 1. The value of the screw dislocation density ratio was adjusted by appropriately varying a thickness and composition of each layer of the buffer layer B. The growth temperature and the film thickness of the buffer layer were finely adjusted so that the total dislocation density might be each value in Table 3 (FIG. 4) and the screw dislocation density ratio might be approximately 0.2. Other conditions (including process and evaluation) were similar to those in Example 1.

It should be noted that the screw dislocation density ratio of 0.2 precisely includes those within a range from 0.195 to 0.205. This is because it is practically difficult to set the screw dislocation density ratio to 0.2 precisely in all preferred embodiments by adjusting the growth temperature or film thickness.

Evaluation of the withstand voltages is as follows: One that is less than 500 V is indicated by "x", one that is from 500 V to 600 V is indicated by "Δ", and one that exceeds 600 V is indicated by "○". Evaluation of the current collapses is as follows: One having an ON resistance ratio of 3 or more is indicated by "x", one having an ON resistance ratio of 2 or more and less than 3 is indicated by "Δ", and one having an ON resistance ratio of 2 or less is indicated by "○". Evaluation of the radii of curvature of the substrates is as follows: One having a radius of curvature of ±15 m or greater is indicated by "○", one having a radius of curvature other than ±15 m or greater is indicated by "Δ", and one having a crack is indicated by "x".

With respect to three evaluation criteria of the withstand voltage, the current collapse, and the radius of curvature of the substrate, a substrate having at least one "x" or having two or more "Δ" is comprehensively evaluated as "x", and a substrate having at least one "Δ" is comprehensively evaluated as "Δ". Accordingly, a substrate having the comprehensive evaluation of "○" or "Δ" is considered as having the effect of the present invention.

From the results of Table 2 (FIG. 3), Examples of the present invention show good results in terms of the radius of curvature, the withstand voltage, and the current collapse. Further, in the case where the carbon concentration of the buffer layer is $1 \times 10^{18}$ atoms/cm$^3$ or $1 \times 10^{20}$ atoms/cm$^3$, a significant difference is not seen from three evaluation criteria. However, they are somewhat inferior to those within the preferred range from a viewpoint with the controllability of adjusting the total dislocation density and the screw dislocation density ratio into the predetermined range.

Examples 8-11, Comparative Example 6

The growth temperature and the film thickness of the buffer layer B were finely adjusted so that the total dislocation density might be each value in Table 3 (FIG. 4) and the screw dislocation density ratio might be approximately 0.2. Other conditions (including process and evaluation) were similar to those in Example 1.

From the results of Table 3 (FIG. 4), when the total dislocation density is less than $1.2 \times 10^9$ cm$^{-2}$, the so-called controllability, of the dislocation density, of causing the total dislocation density to be a predetermined value is worsened, and there is a possibility of affecting the suitable control of the radius of curvature. In particular, there is a tendency for the curvature control of the substrate in connection with the radius of curvature to be inferior to those within the preferred range.

On the other hand, when the total dislocation density exceeds the range of $15 \times 10^9$ cm$^{-2}$, the influence of the total dislocation density becomes excessive beyond the effects of the preferred embodiments of the present invention, thus it has a tendency to be unsuitable for the nitride semiconductor substrate.

In addition, the Si single crystal substrates W were chosen which respectively had thicknesses of 250 μm, 300 μm, 900 μm, 1500 μm, and 2500 μm at one point in the center of the principal plane. Other conditions (including process and evaluation) were similar to those in Example 1. According to the evaluation, some substrates being out of the range from 300 to 2000 μm which is the preferred range of the present invention have a possibility that the curvature may increase or substrate handling may be worsened beyond the effect of the enforcement range of the present invention. They are relatively inferior to those within the preferred range of the present invention.

The nitride semiconductor substrate in accordance with the present invention is suitable for a high-electron mobility transistor, a heterojunction field-effect transistor, etc. In particular, it is advantageous for the device whose vertical withstand voltage is important.

What is claimed is:

1. A nitride semiconductor substrate in which an active layer of a nitride semiconductor is formed on one principal plane of a Si single crystal substrate through a plurality of buffer layers made of a nitride, wherein in said buffer layers, a carbon concentration of a layer which is in contact with at least said active layer is from $1\times10^{18}$ to $1\times10^{20}$ atoms/cm$^3$, a ratio of a screw dislocation density to the total dislocation density is from 0.15 to 0.3 in an interface region between said buffer layer and said active layer, and said total dislocation density in the interface region between said buffer layer and said active layer is $15\times10^9$ cm$^{-2}$ or less.

2. A nitride semiconductor substrate as claimed in claim 1, characterized in that the total dislocation density in the interface region between the buffer layer and the active layer is from $1.2\times10^9$ to $15\times10^9$ cm$^{-2}$.

* * * * *